United States Patent
Jin et al.

(10) Patent No.: US 10,811,520 B2
(45) Date of Patent: Oct. 20, 2020

(54) SEMICONDUCTOR DEVICE AND METHOD FOR MANUFACTURING SAME

(71) Applicant: CSMC TECHNOLOGIES FAB2 CO., LTD., Wuxi New District, Jiangsu (CN)

(72) Inventors: Huajun Jin, Jiangsu (CN); Guipeng Sun, Jiangsu (CN)

(73) Assignee: CSMC TECHNOLOGIES FAB2 CO., LTD., Wuxi New District, Jiangsu (CN)

( * ) Notice: Subject to any disclaimer, the term of this patent is extended or adjusted under 35 U.S.C. 154(b) by 0 days.

(21) Appl. No.: 16/462,432

(22) PCT Filed: Jul. 3, 2018

(86) PCT No.: PCT/CN2018/094316
§ 371 (c)(1),
(2) Date: May 20, 2019

(87) PCT Pub. No.: WO2019/007335
PCT Pub. Date: Jan. 10, 2019

(65) Prior Publication Data
US 2019/0378912 A1 Dec. 12, 2019

(30) Foreign Application Priority Data
Jul. 3, 2017 (CN) .......................... 2017 1 0534707

(51) Int. Cl.
*H01L 29/66* (2006.01)
*H01L 29/78* (2006.01)

(52) U.S. Cl.
CPC ...... *H01L 29/6656* (2013.01); *H01L 29/6653* (2013.01); *H01L 29/78* (2013.01)

(58) Field of Classification Search
CPC .. H01L 29/6656; H01L 29/6653; H01L 29/78
(Continued)

(56) References Cited

U.S. PATENT DOCUMENTS

| 5,489,546 A | 2/1996 | Ahmad et al. |
| 5,789,298 A | 8/1998 | Gardner et al. |

(Continued)

FOREIGN PATENT DOCUMENTS

| CN | 101719512 | 6/2010 |
| CN | 101752251 | 6/2010 |

(Continued)

OTHER PUBLICATIONS

International Search Report issued for International Patent Application No. PCT/CN2018/094316, dated Sep. 26, 2018, 5 pages including English translation.

*Primary Examiner* — Tong-Ho Kim
(74) *Attorney, Agent, or Firm* — Hamre, Schumann, Mueller & Larson, P.C.

(57) ABSTRACT

A method for manufacturing a semiconductor device, includes: forming a well region (201) in a semiconductor substrate (200) and forming a channel region (202) in the well region (201), and forming a gate oxide layer (210) and a polysilicon layer (220) on the well region (201); etching a portion of the gate oxide layer (210) and the polysilicon layer (220), and exposing a first opening (221) used for forming a source region and a second opening (223) used for forming a drain region; forming a first dielectric layer (230) and a second dielectric layer (240) on the polysilicon layer (220) and in the first opening (221) and the second opening (223) successively, and forming a source region side wall at a side surface of the first opening (221) and forming a drain region side wall at a side surface of the second opening (223); forming a dielectric oxide layer (250) on the polysilicon layer (220), etching the dielectric oxide layer and retaining the dielectric oxide layer (250) located on the drain region side wall; removing the second dielectric layer (240)

(Continued)

in the source region side wall and retaining the first dielectric layer (230) therein.

20 Claims, 4 Drawing Sheets

(58) Field of Classification Search
USPC .......................................................... 257/288
See application file for complete search history.

(56) References Cited

U.S. PATENT DOCUMENTS

| | | |
|---|---|---|
| 5,950,091 A | 9/1999 | Fulford, Jr. et al. |
| 7,892,928 B2 | 2/2011 | Cheng et al. |
| 2007/0077709 A1 | 4/2007 | Kim |
| 2009/0159936 A1 | 6/2009 | Shah et al. |
| 2015/0155231 A1* | 6/2015 | Terada ................ G02F 1/13439 257/368 |

FOREIGN PATENT DOCUMENTS

| | | |
|---|---|---|
| CN | 102544095 | 7/2012 |
| CN | 103811496 | 5/2014 |
| CN | 106328523 | 1/2017 |

* cited by examiner

SEMICONDUCTOR DEVICE AND METHOD FOR MANUFACTURING SAME

TECHNICAL FIELD

The present disclosure relates to semiconductor technology, and more particularly to a semiconductor device and method for manufacturing the same.

BACKGROUND

In the semiconductor technology, even if the size of components continues to decrease, it is still expected that the performance of transistors will be improved. It is also expected that an integrated circuit semiconductor device combining low-voltage, mid-voltage and high-voltage applications will be manufactured. However, a distance between polysilicon layers in a metal oxide semiconductor (MOS) is limited to a certain size and cannot be reduced due to the limitation of on-line process capability control.

SUMMARY

It is provided a semiconductor device and method for manufacturing the same according to various embodiments of the present disclosure.

A method for manufacturing a semiconductor device, including:

forming a well region in a semiconductor substrate and forming a channel region in the well region, and forming a gate oxide layer and a polysilicon layer on the well region;

etching a portion of the gate oxide layer and the polysilicon layer, and exposing a first opening used for forming a source region and a second opening used for forming a drain region;

forming a first dielectric layer and a second dielectric layer on the polysilicon layer and in the first opening and the second opening successively, and forming a source region side wall at a side surface of the first opening and forming a drain region side wall at a side surface of the second opening;

forming a dielectric oxide layer on the polysilicon layer, etching the dielectric oxide layer and retaining the dielectric oxide layer located on the drain region side wall;

removing the second dielectric layer in the source region side wall and retaining the first dielectric layer.

In addition, a semiconductor device is also provided, which includes:

a semiconductor substrate providing with a well region therein and a channel region located in the well region;

a gate oxide layer and a polysilicon layer located on the semiconductor substrate, and a first opening used for forming a source region and a second opening used for forming a drain region located on the gate oxide layer and the polysilicon layer;

a source region side wall located at a side surface of the first opening and a drain region side wall located at a side surface of the second opening, the source region side wall being a first dielectric layer, and the drain region side wall including the first dielectric layer and a second dielectric layer which are successively overlapped; and a dielectric oxide layer located on the drain region side wall.

The details of one or more embodiments of the present disclosure are set forth in the accompanying drawings and description below. Other features, objects, and advantages of the present disclosure will be apparent from the description, drawings and claims.

BRIEF DESCRIPTION OF THE DRAWINGS

To describe and illustrate the embodiments and/or examples disclosed herein by the present disclosure more clearly, one or more accompanying drawings could be referred. Additional details or examples used to describe the accompanying drawings should not be considered as limiting the scope of any one of the disclosed application, the embodiments and/or examples currently described, and the best modes of the present disclosure currently understood.

DETAILED DESCRIPTION OF THE EMBODIMENTS

For the convenience of understanding the present disclosure, a more comprehensive description of the present disclosure will be made with reference to the accompanying drawings. A preferred embodiment of the present disclosure is given in the accompanying drawings. However, the present disclosure may be implemented in many different forms and is not limited to the embodiments described herein. Rather, the purpose of providing these embodiments is to make the disclosure of the present disclosure more thorough and comprehensive.

Unless otherwise defined, all terms (including technical and scientific terms) used herein have the same meaning as commonly understood by those persons skilled in the art to which this disclosure belongs. The terms used in the description of the present disclosure are only for the purpose for describing specific embodiments, and could not limit the present disclosure. The term "and/or" used herein should include any one of and all of the combinations of one or more relevant listed items.

Figure 1:
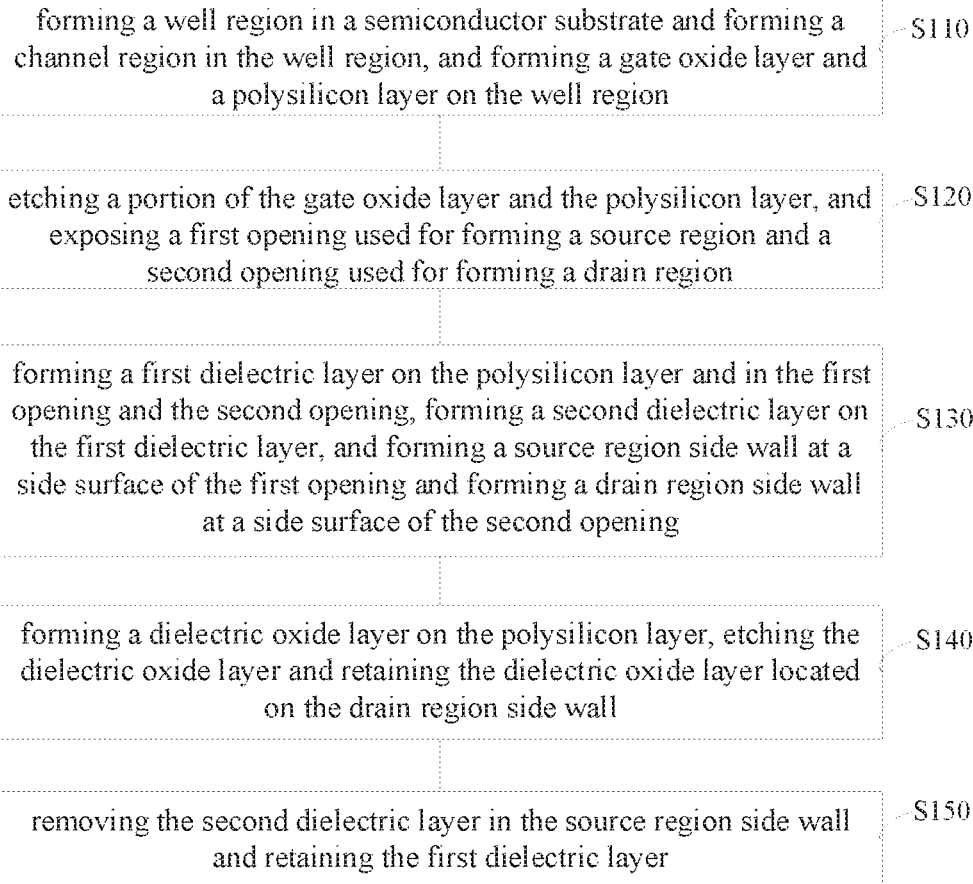
FIG. 1 is a flowchart of a method for manufacturing a semiconductor device in an embodiment.

FIG. 1 is a flowchart of a method for manufacturing a semiconductor device in an embodiment, the method for manufacturing the semiconductor device includes following steps.

At step S110, a well region is formed in a semiconductor substrate and a channel region is formed in the well region, and a gate oxide layer and a polysilicon layer are formed on the well region.

Figure 2A:
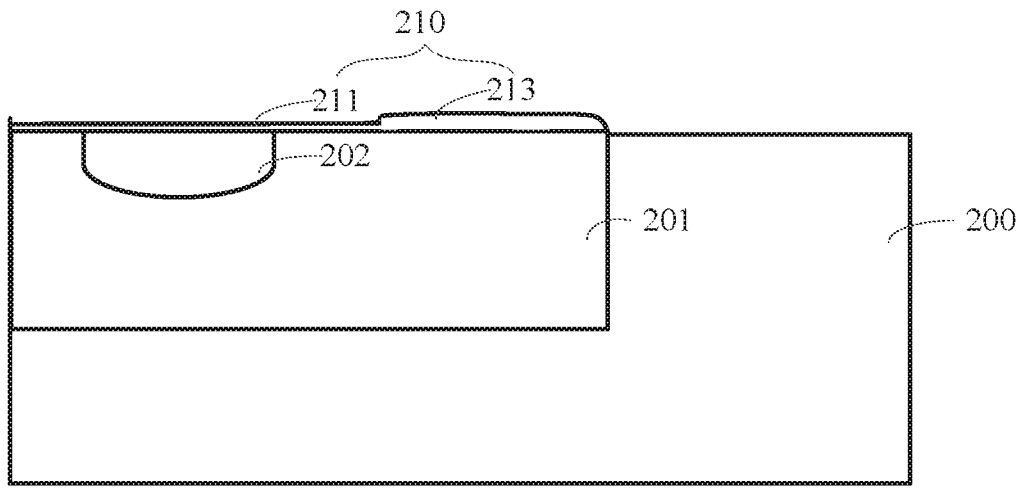
FIGS. 2A to 2J are cross-sectional views of devices respectively achieved by successively implementing steps of the method according to an embodiment.

As shown in FIG. 2A, a semiconductor substrate 200 is provided, and constituent materials of the semiconductor substrate 200 may include single crystal silicon without doping, single crystal silicon doping with impurity, silicon-on-insulator (SOI), stacked silicon-on-insulator (SSOI), stacked SiGe-on-insulator (S—SiGeOI), SiGe-on-insulator (SiGeOI), germanium-on-insulator (GeOI), and the like. In the present embodiments, a P-type semiconductor substrate 200 could be selected as the constituent materials of the semiconductor substrate 200.

In an embodiment, the semiconductor substrate 200 is oxidized to form a buffer layer (a silicon oxide layer without showing in the drawings), a silicon nitride layer is deposited on the buffer layer. A well region 201 is defined by photoetching and the silicon oxide layer is etched via reaction ions. An N-type well region 201 is formed by implanting phosphorus (P+) and then arsenic (As+) into the semiconductor substrate 200 by ion implantation. In another embodiment, a conduction type of the semiconductor substrate as well as the conduction type of the well region 201 deposed in the semiconductor substrate 200 could be set according to an actual requirement, and should not be limited thereto.

In an embodiment, a channel region 202 is formed in the well region 201 by ion implantation or other ways.

In an embodiment, a gate oxide layer 210 is formed on the semiconductor substrate 200 by a thermal oxidation process or a chemical oxidation process.

Specifically, the gate oxide layer 210 includes a first gate oxide layer region 211 corresponding to a source region in a vertical direction and a second gate oxide layer region 213 corresponding to a drain region in the vertical direction. A thickness of the first gate oxide layer region 211 is smaller than that of the second gate oxide layer region 213.

Furthermore, the thickness of the first gate oxide layer region 211 is 15 nm (nanometer), and the thickness of the second gate oxide layer region 213 is 44 nm. A voltage of the drain region could be increased since the thickness of the second gate oxide layer region 213 is greater than that of the first gate oxide layer region 211. A high-voltage metal oxide semiconductor (MOS) device may be formed by forming different thickness of the gate oxide layer 210 in different regions.

Figure 2B:
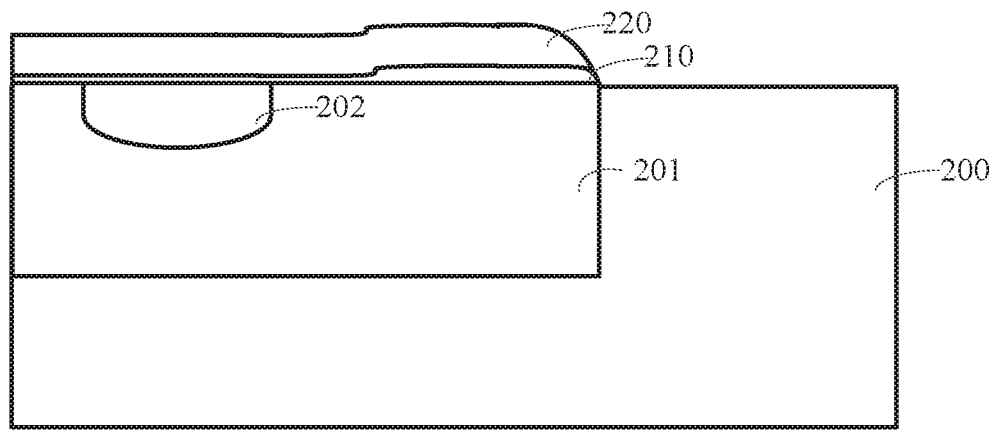

As shown in FIG. 2B, the method for manufacturing the semiconductor device also includes a step of forming a polysilicon layer 220 on the gate oxide layer 210. A method for forming the polysilicon layer 220 may use a method of chemical vapor deposition, such as a low-temperature chemical vapor deposition, a low-pressure chemical vapor deposition, a rapid thereto chemical vapor deposition, and other ions enhanced chemical vapor deposition.

Specifically, a thickness of the polysilicon layer 220 is 180 nm to 220 nm, and in the present embodiment, the thickness of the polysilicon layer 220 is 200 nm.

At step S120, a portion of the gate oxide layer and the polysilicon layer is etched, and a first opening used for forming the source region and a second opening used for forming the drain region are exposed.

Figure 2C:
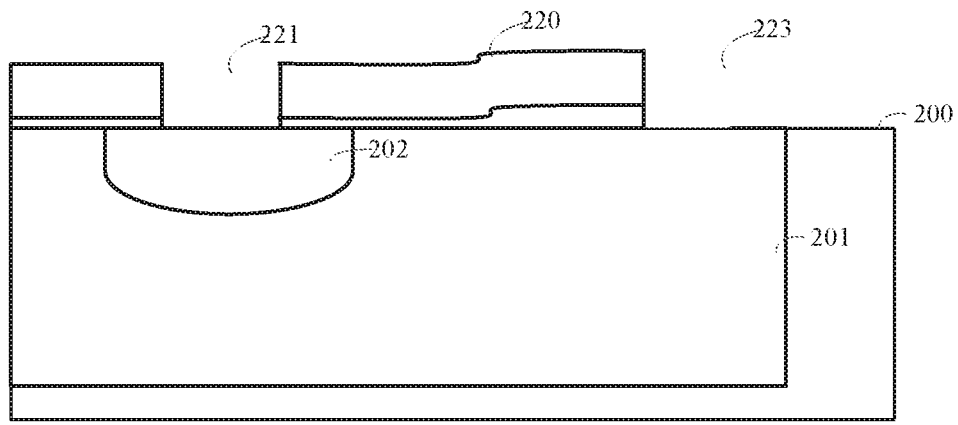

As shown in FIG. 2C, the portion of the gate oxide layer 210 and the polysilicon layer 220 are etched simultaneously, and the first opening 221 and the second opening 223 are formed by etching. A bottom surface of the first opening 221 is a top surface of a portion of the channel region 202, and a location for subsequently forming a source region side wall and the source region can be defined by the first opening 221. The second opening 223 is separated from the first opening 221, and a bottom surface of the second opening 223 is a top surface of the well region 201. A location for subsequently forming a drain region side wall and the drain region can be defined by the second opening 223.

A process for forming the first opening 221 and the second opening 223 includes: forming a mask layer having a pattern of the first opening 221 and the second opening 223 on the polysilicon layer 220, where the mask layer is formed by a conventional photoetching process or an etching process, and the mask layer may have a single layer structure or multiple layers structure, the mask layer with the single layer structure is a patterned photoresist layer, and the mask layer with the multiple layers structure may include a patterned advanced patterned layer, a patterned anti-reflective coating layer and a patterned photoresist layer which are overlapped from bottom to top; using the mask layer as a mask, while etching the gate oxide layer 210 and the polysilicon layer 220 to form the first opening 221 and the second opening 223 at the gate oxide layer 210 and the polysilicon layer 220, where the etching process may be a conventionally anisotropic dry etching, removing the mask layer, where a conventional asking process could be used for removing the mask layer; implementing a wet cleaning, to remove a byproduct and impurity generated by the etching process.

In an embodiment, the channel region 202 in the well region 201 can also be formed by implanting ions from the first opening 221, after forming the first opening 221.

At step S130, a first dielectric layer is formed on the polysilicon layer and in the first opening and the second opening, a second dielectric layer is formed on the first dielectric layer, and a source region side wall is formed at a side surface of the first opening, a drain region side wall is formed at a side surface of the second opening.

Figure 2D:
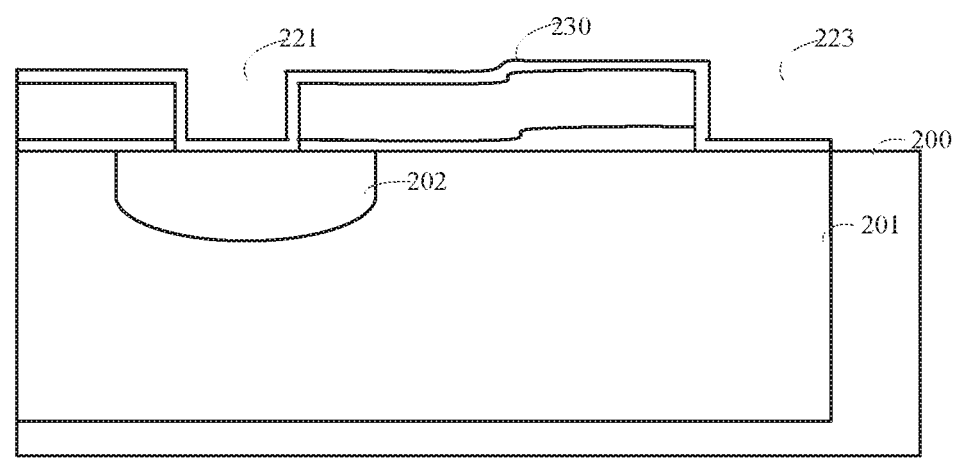

As shown in FIG. 2D, in an embodiment, the first dielectric layer 230 is formed at the polysilicon layer 220 (not shown in the figure), the first opening and the second opening 223. The first dielectric layer 230 is formed at a side surface and a bottom surface of the first opening 221, and the first dielectric layer 230 is formed at a side surface and a bottom surface of the second opening 223, but the first dielectric layer 230 does not fill with the first opening 221 and the second opening 223.

Figure 2E:
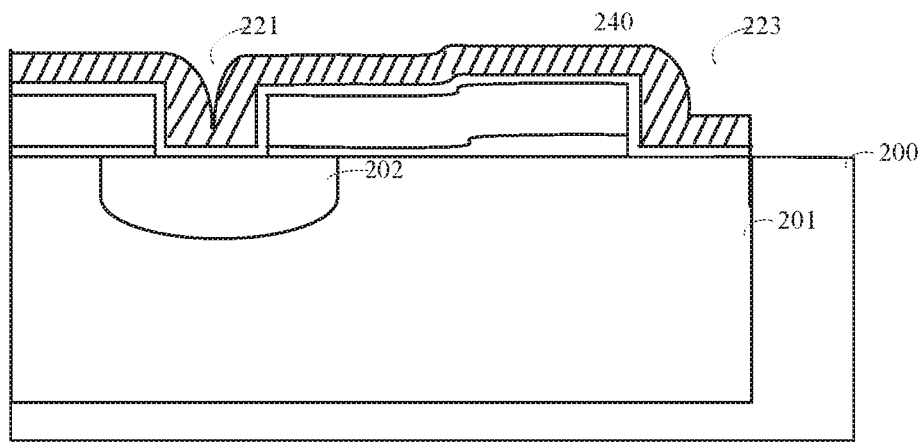

As shown in FIG. 2E, in further, a second dielectric layer 240 is formed on the first dielectric layer 230 (not shown in the figure). A thickness of the second dielectric layer 240 is greater than that of the first dielectric layer 230. The method for forming the first dielectric layer 230 as well as the second dielectric layer 240 can both use the method of chemical vapor deposition, such as a low-temperature chemical vapor deposition, a low-pressure chemical vapor deposition, a rapid thermal chemical vapor deposition, and other ions enhanced chemical vapor deposition.

In an embodiment, the first dielectric layer 230 is an oxide layer, and a thickness of the oxide layer ranges from 8 nm to 12 nm. The second dielectric layer 240 is a silicon nitride layer, and a thickness of the silicon nitride layer ranges from 80 nm to 120 nm.

Figure 2F:
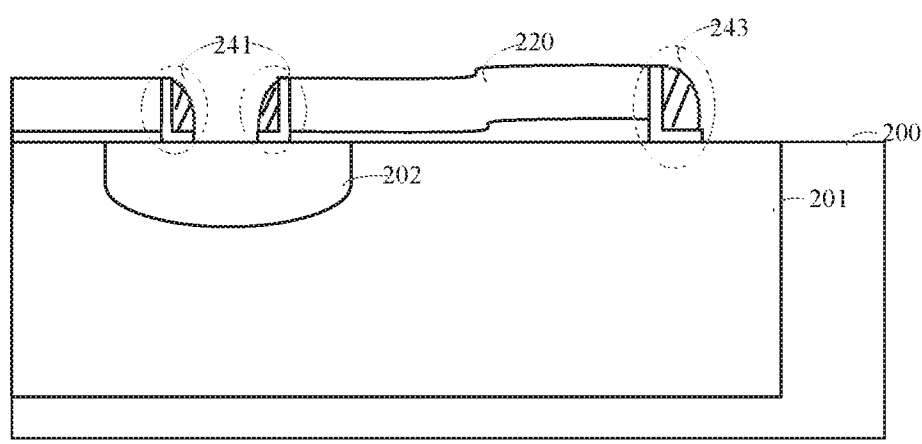

As shown in FIG. 2F, in an embodiment, a source region side wall 241 and a drain region side wall 243 are formed by photoetching process, etching process, and the like. The silicon nitride layer and the oxide layer except for the source region side wall 241 and the drain region side wall 243 are all removed by etching to expose the polysilicon layer 220. Accordingly, the silicon nitride layer and the oxide layer at the middle portion of and within the first opening 221 is also etched to the channel region 202, and a portion of the channel region 202 is exposed. A portion of the silicon nitride layer and the oxide layer in the second opening 223 are etched to the well region 201, and the well region is exposed. The etching may be an anisotropic dry etching and/or an anisotropic wet etching.

At step S140, a dielectric oxide layer is formed on the polysilicon layer, the dielectric oxide layer is etched and the dielectric oxide layer located on the drain region side wall is retained.

Figure 2G:
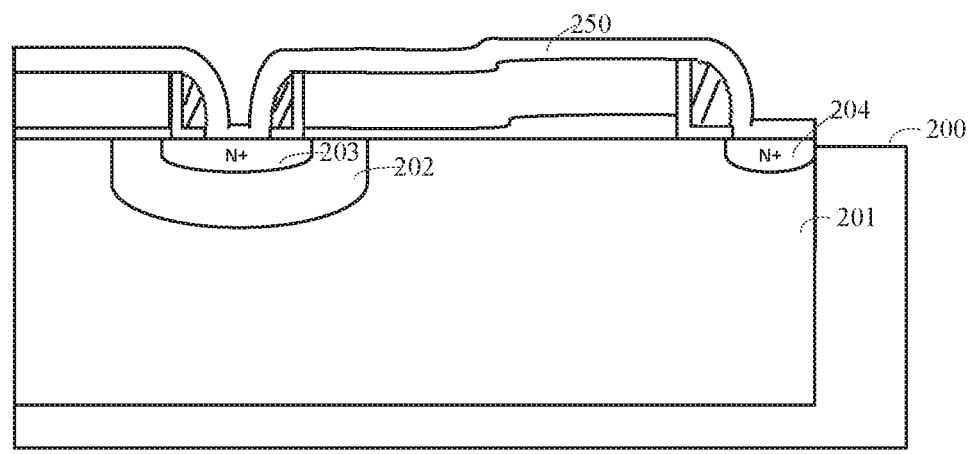

As shown in FIG. 2G, a dielectric oxide layer 250 is formed on the polysilicon layer 220 by deposition. The dielectric oxide layer 250 is also formed at the side surface of the source region side wall 241 and a bottom (the channel region 202) of the first opening 221, besides the dielectric oxide layer 250 is also formed at the side surface of the drain region side wall 243 and a bottom (the well region 201) of the second opening 223.

Figure 2H:
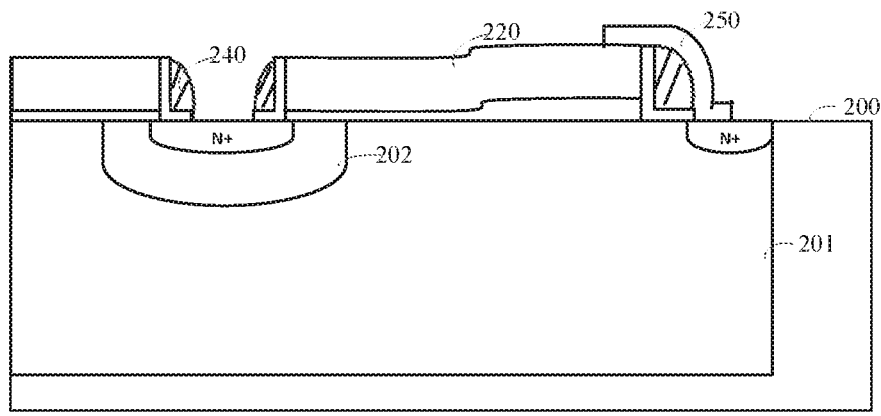

As shown in FIG. 2H, a barrier layer for preventing the drain side wall 243 from being etched out is formed by etching the dielectric oxide layer 250 using a photoetching plate of the dielectric oxide layer 250. That is, the dielectric oxide layer 250 on the drain region side wall 243 has not been etched, and the drain region side wall 243 includes a double layer structure with the gallium nitride layer and the dielectric oxide layer, therefore, the electric field strength of a drain end can be reduced by the dielectric oxide layer 243, which is beneficial to the breakdown performance of the device. The dielectric oxide layer 250 may be a silicon oxide (SiO2) layer.

At step S150, the second dielectric layer in the source region side wall is removed and the first dielectric layer therein is retained.

Figure 2I:
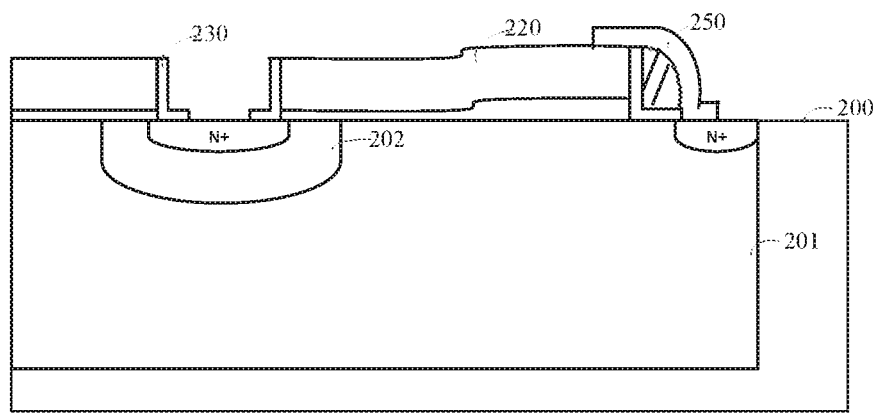

As shown in FIG. 2I, after the dielectric oxide layer 250 is etched, the second dielectric layer 240 (silicon nitride layer) of the source region (having an end of the channel region 202) side wall 241 is rinsed by wet rinse, so that there is only one dielectric layer of the first dielectric layer 230 (oxide layer) in the dielectric layer of the source region side wall 241. That is, it can be implemented that a transverse thickness of the source region side wall 241 (it can be also referred to as the thickness of the first dielectric layer 230) is reduced with respect to that of the drain region side wall 243 without changing the structure of the drain region, thereby shortening a distance of the polysilicon layer 220 corresponding to the source region, that is, a size of the entire semiconductor device is reduced and an on-resistance of the semiconductor device is lowered.

In a conventional technology, if a distance of polysilicon layer is shortened, a width of the side wall must be reduced. However, in a general process, the source region side wall and the drain region side wall are formed at the same time, if a width of the source region side wall or of the source region side wall is reduced, the electric field intensity of the drain region may be enhanced as the drain region side wall is reduced, thus the leakage enhancement of the semiconductor device in a cut-off state is affected. According to the afore-mentioned method for manufacturing the semiconductor device, the transverse thickness of the side wall of source end is reduced, and the distance of the polysilicon layer 220 corresponding to the source region is shortened, that is, the size of entire semiconductor device is reduced and the on-resistance of the semiconductor device is lowered. Meanwhile, the barrier layer is formed by using the conventional photoetching plate at the photoetching level, the double layers of the dielectric layer in the drain region side wall 243 are retained, and the cost of the process is reduced, at the same time, it can be ensured that the electric field in the drain region does not change and an original performance of the semiconductor device will not be affected.

In an embodiment, prior to the step S140 of forming the dielectric oxide layer 250 on the polysilicon layer 220, the method for manufacturing the semiconductor device also includes a step of forming the source region 203 and the drain region 204 in the well region 201.

As shown in FIG. 2G, in an embodiment, the method for manufacturing the semiconductor device also includes that forming the source region 203 and the drain region 204 in the semiconductor substrate by using a process of implanting phosphorus ions or implanting arsenic ions. Since both of the source region 203 and the channel region 202 in the semiconductor substrate are formed prior to the step S150, an impurity distribution of the source region will not be affected.

In an embodiment, after the step S150 of removing the second dielectric layer in the source region side wall and retaining the first dielectric layer therein, it also includes a step of forming an inter-level dielectric layer on the polysilicon layer, and a step of forming a contact hole in the inter-level dielectric layer.

Figure 2J:
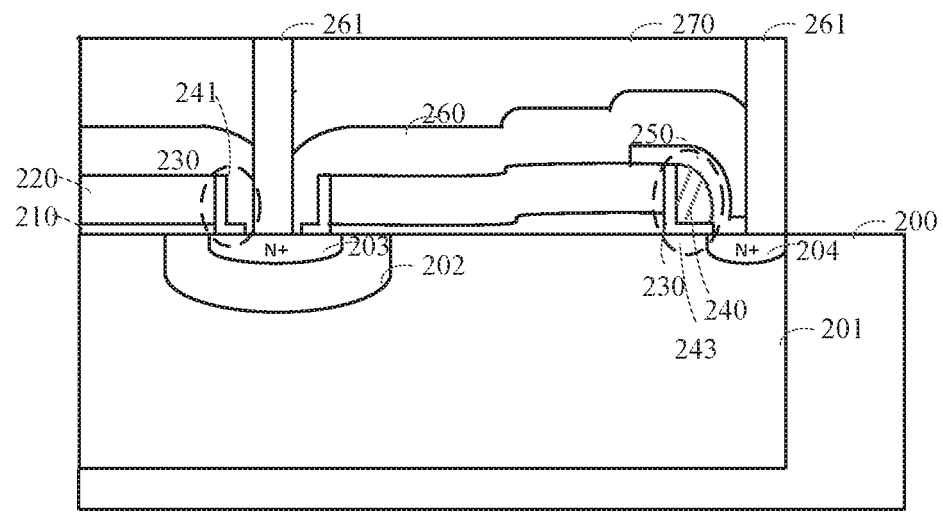

As shown in FIG. 2J, in an embodiment, the method for manufacturing the semiconductor device also includes forming a first inter-level dielectric layer 260 and a second inter-level dielectric layer 270 on the semiconductor substrate. As an example, a material of the first inter-level dielectric layer 260 and the second inter-level dielectric layer 270 is a material with low dielectric constant. The material with low dielectric constant includes, but does not limit to, a Hydrogen Silsesquioxane (referred to as HSQ) with a K value of 2.5 to 2.9, a Methyl Silsesquioxane (referred to as MSQ) with a K value of 2.2, a porousness silicon dioxide (SiO2) formed by the chemical vapor deposition method, and the like. The method for forming the first inter-level dielectric layer 260 as well as the second inter-level dielectric layer 270 can both use the method of chemical vapor deposition, such as the low-temperature chemical vapor deposition, the low-pressure chemical vapor deposition, the rapid thereto chemical vapor deposition, and other ions enhanced chemical vapor deposition. As shown in FIG. 2J, in an embodiment, the method for manufacturing the semiconductor device also includes forming the contact hole 261 passing through the first inter-level dielectric layer 260 and the second inter-level dielectric layer 270 by a photoetching process and an etching process. As an example, a mask layer with a pattern of the contact hole 261 is formed on the second inter-level dielectric layer 270, the first inter-level dielectric layer 260 and the second inter-level dielectric layer 270 are etched with the mask layer as a mask, and the contact hole 261 exposing the source region 203 and the drain region 204 is formed in the first inter-level dielectric layer 260 and the second inter-level dielectric layer 270. The contact hole is filled with a metal layer after removing the mask layer, so as to form a metal connecting line.

The conventional drain region side wall includes the first dielectric layer and the second dielectric layer (silicon nitride layer), when the gallium nitride of the drain region side wall is etched during forming the contact hole, an etching rate of the gallium nitride layer is low, resulting in that the contact hole may not be etched to pass to the source region. In order to prevent an abnormal etching for the contact hole, it is necessary to limit a safe distance between the contact hole and the silicon nitride layer. That is, it should be ensured that the contact hole 261 may not contact with the second dielectric layer 240 (silicon nitride layer) in the source region side wall 241 as well as the second dielectric layer 240 (silicon nitride layer) in the drain region side wall 243 while forming the contact hole 261, it is necessary to ensure that the distance between the contact hole 261 and the polysilicon layer 220 is greater than the width of the source region side wall 241 or of the drain region side wall 243. Since the second dielectric layer 240 (silicon nitride layer) in the source region side wall 241 has been rinsed, the smaller the width of the source region side wall 241, the shorter the distance between the contact hole 261 and the polysilicon layer 220, and the shorter the distance of the polysilicon layer 220.

The semiconductor device manufactured by the above-described method may be an N-type MOS, a P-type MOS, a high-voltage MOS, and the like. According to the afore-described method for manufacturing the semiconductor device, the transverse thickness of the side wall of the source end may be reduced, and the distance of the polysilicon layer 220 corresponding to the source region may be shortened, that is, the size of the entire semiconductor device may be reduced and the on-resistance of the semiconductor device may be lowered. Meanwhile, the double layers of the dielectric layer in the drain region side wall 243 are retained by using the conventional barrier layer, and the cost of the process is reduced, at the same time, it can be ensured that the electric field in the drain region does not change and an original performance of the semiconductor device will not be affected.

In addition, a semiconductor device is provided as well, as shown in FIG. 2J, the semiconductor device includes: a semiconductor substrate (not shown in the figure) providing with a well region 201 therein and a channel region 202 located in the well region 201; a gate oxide layer 210 and a polysilicon layer 220 located on the semiconductor substrate, and a first opening (not shown in the figure) used for forming a source region 203 and a second opening (not shown in the figure) used for forming a drain region 204 located on the gate oxide layer 210 and the polysilicon layer 220; a source region side wall 241 located at a side surface of the first opening and a drain region side wall 243 located at a side surface of the second opening, where the source region side wall 241 includes a first dielectric layer 230, and the drain region side wall 243 includes the first dielectric layer 230 and a second dielectric layer 240 which are successively overlapped; and a dielectric oxide layer 250 located on the drain region side wall 243.

In an embodiment, the first dielectric layer 230 is an oxide layer, and the second dielectric layer 240 is a silicon nitride layer.

Specifically, a thickness of the oxide layer ranges from 8 nm to 12 nm, and a thickness of the silicon nitride layer ranges from 80 nm to 120 nm.

In an embodiment, the semiconductor device also includes the source region 203 and the drain region 204 located in the well region 201, where the source region 203 and the drain region 204 are formed by using the process of implanting phosphorus ions or implanting arsenic ions. The source region is formed corresponding to the first opening and the drain region is formed corresponding to the second opening.

In an embodiment, the semiconductor device also includes an inter-level dielectric layer 260 located on the polysilicon layer 220, and a contact hole 261 located in the inter-level dielectric layer 260.

A material of the first inter-level dielectric layer 260 may be a material with low dielectric constant. The material with low dielectric constant includes, but does not limit to, the Hydrogen Silsesquioxane (referred to as FISQ) with the K value of 2.5 to 2.9, the Methyl Silsesquioxane (referred to as MSQ) with the K value of 2.2, the porousness silicon dioxide (SiO2) formed by the chemical vapor deposition method, and the like. The method for forming the first inter-level dielectric layer 260 can use the method of chemical vapor deposition, such as the low-temperature chemical vapor deposition, the low-pressure chemical vapor deposition, the rapid thermo chemical vapor deposition, and other ions enhanced chemical vapor deposition. The contact hole 261 passing through the inter-level dielectric layer 260 is formed by the photoetching process and the etching process. As an example, a mask layer with a pattern of the contact hole 261 is formed on the inter-level dielectric layer 260, the inter-level dielectric layer 260 is etched with the mask layer as a mask, and the contact hole 261 exposing the well region 201 is formed in the inter-level dielectric layer 260. The contact hole is filled with a metal layer after removing the mask layer, so as to form a metal connecting line. It should be ensured that the contact hole 261 may not contact with the source region side wall 241 as well as the drain region side wall 243 while forming the contact hole 261, it is necessary to ensure that the distance between contact hole 261 and polysilicon layer 220 is greater than the width of the source region side wall 241 or the drain region side wall 243. The smaller the width of the source region side wall 241 or the drain region side wall 243, the shorter the distance between the contact hole 261 and the polysilicon layer 220, and the shorter the distance of the polysilicon layer 220.

The semiconductor device may be the N-type MOS transistor, the P-type MOS transistor, the high-voltage MOS transistor, and the like. In view of the afore-described semiconductor device, the transverse thickness of the side wall of source end is reduced, and the distance of the polysilicon layer 220 corresponding to the source region is shortened, that is, the size of the entire semiconductor device is reduced and the on-resistance of the semiconductor device is lowered. Meanwhile, the double layers of the dielectric layer in the drain region side wall are retained by using the conventional barrier layer, and the cost of the process is reduced, at the same time, it can be ensured that the electric field in the drain region does not change and an original performance of the semiconductor device will not be affected.

The technical features of the above-mentioned embodiments may be arbitrarily combined. For the sake of concise description, not all possible combinations of the technical features in the above-mentioned embodiments are described. However, as long as there is no contradiction between the combinations of these technical features, it should be considered as the scope of the present description.

The above described embodiments are merely illustrative of several embodiments of the present disclosure, and the description thereof is more specific and detailed, but is not to be construed as limiting the scope of the present disclosure. It should be noted that several variations and modifications may be made by those persons skilled in the art and belong to the scope of protection of the present disclosure without departing from the spirit. Therefore, the scope of protection of the present disclosure should be subject to the appended claims.

What is claimed is:

1. A method for manufacturing a semiconductor device, comprising:
   forming a well region in a semiconductor substrate and forming a channel region in the well region, and forming a gate oxide layer and a polysilicon layer on the well region;
   etching a portion of the gate oxide layer and the polysilicon layer, and exposing a first opening used for forming a source region and a second opening used for forming a drain region;
   forming a first dielectric layer on the polysilicon layer and in the first opening and the second opening, forming a second dielectric layer on the first dielectric layer, and forming a source region side wall at a side surface of the first opening and forming a drain region side wall at a side surface of the second opening;
   forming a dielectric oxide layer on the polysilicon layer, etching the dielectric oxide layer and retaining the dielectric oxide layer located on the drain region side wall; and
   removing the second dielectric layer in the source region side wall and retaining the first dielectric layer therein.

2. The method for manufacturing a semiconductor device of claim 1, wherein the first dielectric layer is an oxide layer and the second dielectric layer is a silicon nitride layer.

3. The method for manufacturing a semiconductor device of claim 2, wherein a thickness of the oxide layer ranges from 8 nm to 12 nm and a thickness of the silicon nitride layer ranges from 80 nm to 120 nm.

4. The method for manufacturing a semiconductor device of claim 1, wherein the gate oxide layer comprises a first gate oxide layer region corresponding to the source region in a vertical direction and a second gate oxide layer region corresponding to the drain region in the vertical direction; and wherein a thickness of the first gate oxide layer region is smaller than a thickness of the second gate oxide layer region.

5. The method for manufacturing a semiconductor device of claim 4, wherein the thickness of the first gate oxide layer region is 15 nm and the thickness of the second gate oxide layer region is 44 nm.

6. The method for manufacturing a semiconductor device of claim 5, wherein the step of forming the source region and the drain region in the well region comprises: prior to forming the dielectric oxide layer on the polysilicon layer, forming the source region and the drain region in the semiconductor substrate by a process of implanting ions.

7. The method for manufacturing a semiconductor device of claim 1, wherein a thickness of the polysilicon layer ranges from 180 nm to 220 nm.

8. The method for manufacturing a semiconductor device of claim 1, further comprising:

forming the source region and the drain region in the well region.

9. The method for manufacturing a semiconductor device of claim 1, further comprising:

forming an inter-level dielectric layer on the polysilicon layer; and forming a contact hole in the inter-level dielectric layer.

10. The method for manufacturing a semiconductor device of claim 9, wherein a material of the inter-level dielectric layer is a material with low dielectric constant.

11. The method for manufacturing a semiconductor device of claim 9, wherein a distance between the contact hole in the source region and the polysilicon layer is greater than a width of the source region side wall, and a distance between the contact hole in the drain region and the polysilicon layer is greater than a width of the drain region side wall.

12. The method for manufacturing a semiconductor device of claim 1, wherein the step of forming the source region side wall at the side surface of the first opening and forming the drain region side wall at the side surface of the second opening comprises: etching the first dielectric layer and the second dielectric layer; forming the source region side wall at the first dielectric layer and second dielectric layer remaining at the side surface of the first opening, and forming the source region side wall at the first dielectric layer and second dielectric layer remaining at the side surface of the second opening.

13. The method for manufacturing a semiconductor device of claim 1, wherein the dielectric oxide layer is a silicon oxide layer.

14. A semiconductor device, comprising:

a semiconductor substrate providing with a well region therein and a channel region located in the well region;

a gate oxide layer and a polysilicon layer overlapped on the semiconductor substrate, and a first opening used for forming a source region and a second opening used for forming a drain region being located on the gate oxide layer and the polysilicon layer;

a source region side wall located at a side surface of the first opening and a drain region side wall located at a side surface of the second opening, wherein the source region side wall comprises a first dielectric layer, and the drain region side wall comprises the first dielectric layer and a second dielectric layer which are successively overlapped; and a dielectric oxide layer located on the drain region side wall only and not on the source region side wall, wherein the dielectric oxide layer is formed by forming the dielectric oxide layer on the polysilicon layer, and then etching the dielectric oxide layer and only retaining the dielectric oxide layer located on the drain region side wall.

15. The semiconductor device of claim 14, wherein the first dielectric layer is an oxide layer, and the second dielectric layer is a silicon nitride layer.

16. The semiconductor device of claim 15, wherein a thickness of the oxide layer ranges from 8 nm to 12 nm and a thickness of the silicon nitride layer ranges from 80 nm to 120 nm.

17. The semiconductor device of claim 14, wherein a thickness of the polysilicon layer ranges from 180 nm to 220 nm.

18. The semiconductor device of claim 14, further comprising: a first inter-level dielectric layer and a second inter-level dielectric layer located on the polysilicon layer, and a contact hole passing through the first inter-level dielectric layer and the second inter-level dielectric layer.

19. The semiconductor device of claim 18, wherein a material of the inter-level dielectric layer is a material with low dielectric constant.

20. The semiconductor device of claim 18, wherein a distance between the contact hole in the source region and the polysilicon layer is greater than a width of the source region side wall, and a distance between the contact hole in the drain region and the polysilicon layer is greater than a width of the drain region side wall.

* * * * *